United States Patent
Lance et al.

(10) Patent No.: US 9,824,774 B2
(45) Date of Patent: *Nov. 21, 2017

(54) MAGNETIC FIELD PROGRAMMING OF ELECTRONIC DEVICES ON A WAFER

(71) Applicant: FREESCALE SEMICONDUCTOR, INC., Austin, TX (US)

(72) Inventors: Philippe Lance, Toulouse (FR); Lianjun Liu, Chandler, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 14/754,069

(22) Filed: Jun. 29, 2015

(65) Prior Publication Data

US 2016/0276004 A1    Sep. 22, 2016

(30) Foreign Application Priority Data

Mar. 16, 2015 (WO) .................. PCT/IB2015/000515

(51) Int. Cl.
| | |
|---|---|
| *G11C 7/00* | (2006.01) |
| *G11C 29/00* | (2006.01) |
| *G11C 29/12* | (2006.01) |
| *G01R 31/317* | (2006.01) |
| *G11C 11/18* | (2006.01) |
| *G01R 33/07* | (2006.01) |

(Continued)

(52) U.S. Cl.
CPC .......... *G11C 29/12* (2013.01); *G01R 31/2884* (2013.01); *G01R 31/3187* (2013.01); *G01R 31/31724* (2013.01); *G01R 31/31905* (2013.01); *G01R 31/31908* (2013.01); *G01R 33/07* (2013.01); *G01R 33/072* (2013.01); *G11C 11/18* (2013.01)

(58) Field of Classification Search
CPC ......... G11C 11/02; G11C 11/18; G11C 29/12; G11C 11/5607; G01R 31/2884; G01R 31/3187; G01R 31/31908; G01R 33/07
See application file for complete search history.

(56) References Cited

U.S. PATENT DOCUMENTS 6,630,685 B1 * 10/2003 Lunde .................. G11C 29/006
257/48
6,731,122 B2    5/2004 Feng
(Continued)

OTHER PUBLICATIONS

U.S. Appl. No. 14/754,075.*
(Continued)

*Primary Examiner* — Kretelia Graham
(74) *Attorney, Agent, or Firm* — Charlene R. Jacobsen

(57) ABSTRACT

A system for programming integrated circuit (IC) dies formed on a wafer includes a magnetic field transmitter that outputs a digital test program as a magnetic signal. At least one digital magnetic sensor (e.g., Hall effect sensor) is formed with the IC dies on the wafer. The digital magnetic sensor detects and receives the magnetic signal. A processor formed on the wafer converts the magnetic signal to the digital test program and the digital test program is stored in memory on the wafer in association with one of the IC dies. The magnetic field transmitter does not physically contact the dies, but can flood an entire surface of the wafer with the magnetic signal so that all of the IC dies are concurrently programmed with the digital test program.

16 Claims, 5 Drawing Sheets

(51) Int. Cl.
*G01R 31/3187* (2006.01)
*G01R 31/319* (2006.01)
*G01R 31/28* (2006.01)

(56) References Cited

U.S. PATENT DOCUMENTS

| | | | |
|---|---|---|---|
| 6,985,648 B2 | 1/2006 | Kish, Jr. et al. | |
| 7,050,666 B2 | 5/2006 | Welch et al. | |
| 7,057,518 B2 | 6/2006 | Schmidt | |
| 7,062,114 B2 | 6/2006 | Webjorn et al. | |
| 7,262,852 B1 | 8/2007 | Gunn, III et al. | |
| 7,325,180 B2 | 1/2008 | Pileggi et al. | |
| 7,792,396 B2 | 9/2010 | Kish, Jr. et al. | |
| 8,358,147 B2 | 1/2013 | Pagani | |
| 8,606,102 B2 | 12/2013 | Lee et al. | |
| 9,442,159 B2 | 9/2016 | Pagani | |
| 9,471,815 B2 | 10/2016 | Cato et al. | |
| 9,607,911 B2 * | 3/2017 | Liu | H01L 22/30 |
| 2002/0196029 A1 | 12/2002 | Schmidt | |
| 2003/0221152 A1 | 11/2003 | Volkerink et al. | |
| 2004/0017215 A1 | 1/2004 | Mule et al. | |
| 2005/0138499 A1 | 6/2005 | Pileggi et al. | |
| 2006/0049823 A1 | 3/2006 | Suzuki | |
| 2006/0235647 A1 | 10/2006 | Nassif | |
| 2008/0211113 A1 * | 9/2008 | Chua | H01L 21/76898 257/782 |
| 2010/0204566 A1 * | 8/2010 | Uchiyama | A61B 1/00158 600/424 |
| 2011/0204140 A1 * | 8/2011 | Hart | G06Q 20/12 235/380 |
| 2011/0234253 A1 | 9/2011 | Bhaskarani | |
| 2012/0051224 A1 | 3/2012 | Olgaard et al. | |
| 2013/0021048 A1 | 1/2013 | Peng et al. | |

OTHER PUBLICATIONS

U.S. Appl. No. 14/850,432.*
Notice of Allowance for U.S. Appl. No. 14/799,171; 26 pages dated Dec. 16, 2016.
Extended European Search Report for Patent Appln. No. 16160536.5 dated Aug. 24, 2016.
Non Final Office Action, U.S. Appl. No. 14/754,075; 39 pages dated Jun. 21, 2017.

* cited by examiner

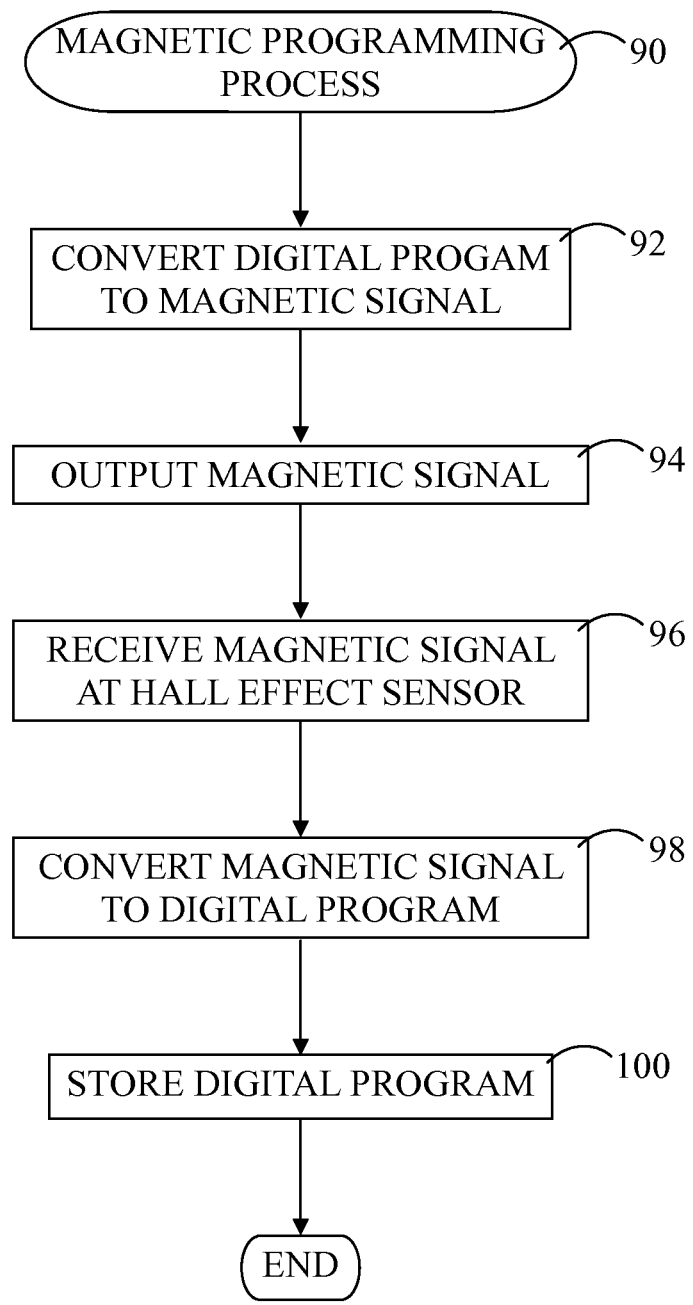

MAGNETIC FIELD PROGRAMMING OF ELECTRONIC DEVICES ON A WAFER

TECHNICAL FIELD OF THE INVENTION

The present invention relates generally to integrated circuits. More specifically, the present invention relates to a system and method for magnetic field programming of integrated circuits on a wafer for wafer level testing.

BACKGROUND OF THE INVENTION

Wafer level probing and/or wafer level chip scale package (WLCSP) testing of a complimentary metal-oxide-semiconductor (CMOS) wafer containing a plurality of integrated circuit (IC) dies typically requires communication between the external test equipment (e.g., tester) and the device under test (e.g., an IC die). A primary aspect of the communication is to download a test program from the tester to each IC die on the wafer and then receive the test results to verify if the IC die under test is a good die or a bad die.

IC dies are increasingly being fabricated with a build-in self-test (BIST) mechanism or function. A BIST function or mechanism permits an IC die to verify all or a portion of the internal functionality of the IC die. Inclusion of a BIST can reduce reliance upon and/or the complexity of external test equipment, thereby reducing test costs. For example, with the inclusion of the BIST mechanism at each IC die, a test program downloaded from the tester may simply initiate execution of the BIST, receive the test result (e.g., pass/fail) from the BIST, and communicate that result back to the tester.

Thus, with the inclusion of a BIST mechanism, wafer level testing is becoming faster due to a reduction in communication between the tester and the devices under test. However, wafer level testing typically entails a process of die-by-die programming and testing in which a probe of the tester must index or step between each of the IC dies on the wafer. The process of indexing or stepping between each of the IC dies on the wafer to perform die-by-die programming and testing is still undesirably time consuming and costly. Therefore, a need exists in the art of wafer level testing to increase the speed of testing and thereby decrease the costs associated with testing.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

FIG. 5 shows a flowchart of a magnetic programming process executed in connection with the wafer test process.

DETAILED DESCRIPTION

In overview, embodiments of the present invention entail a system and methodology for programming integrated circuit (IC) dies formed on or in a wafer. The system includes a magnetic field transmitter located at, for example, a probe card of a wafer tester and digital magnetic sensors, e.g., Hall effect sensors, formed with the IC dies on the wafer. The magnetic field transmitter outputs a test program in the form of a magnetic signal that is detectable by receiving devices, e.g., the Hall effect sensors. This magnetic signal is converted back to the test program and the test program is stored in association with each of the IC dies. By utilizing a magnetic programming approach, all of the IC dies on the wafer can be programmed concurrently without the need for communication between the tester and each individual IC die. Accordingly, test time and cost can be dramatically reduced. Furthermore, by combining the magnetic programming approach for download of a test program with built-in self-test (BIST) functionality, wafer level testing/probing of the IC dies can be carried out without indexing or stepping the tester between each of the IC dies on the wafer.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. It should be further understood that the use of relational terms, if any, such as first and second, top and bottom, and the like are used solely to distinguish one from another entity or action without necessarily requiring or implying any actual such relationship or order between such entities or actions.

Figure 1:
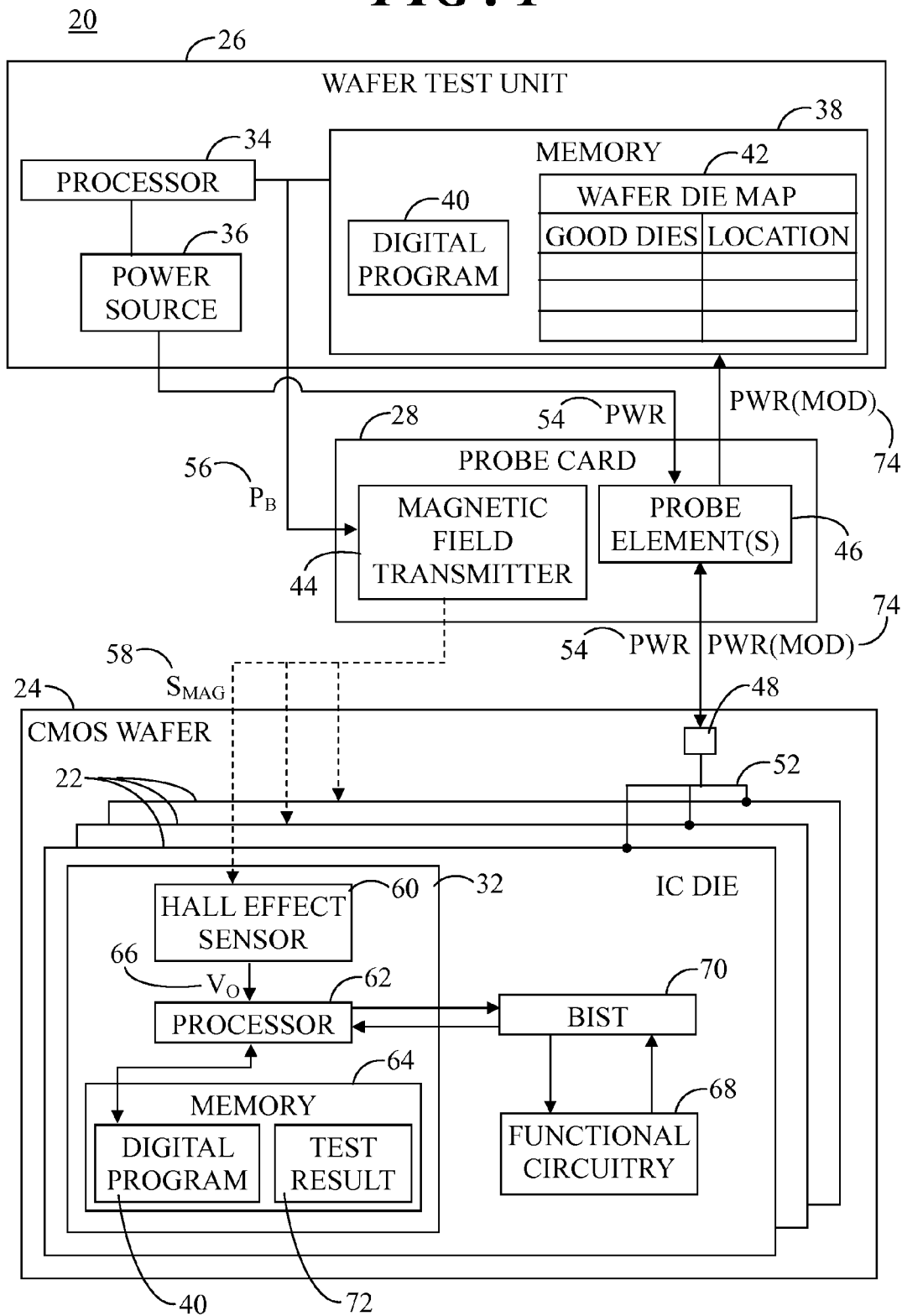
FIG. 1 shows a block diagram of a system for programming and testing integrated circuit (IC) dies formed on or in a wafer in accordance with an embodiment.

Referring now to FIG. 1, FIG. 1 shows a block diagram of a system 20 for remote programming and testing integrated circuit (IC) dies 22 formed on or in a wafer 24 in accordance with an embodiment. IC dies 22 may encompass microprocessors, microcontrollers, static random access memory (RAM), and other digital logic circuits fabricated in accordance with complementary metal-oxide-semiconductor (CMOS) process technology. IC dies 22 may further encompass some analog circuits such as CMOS image sensors, data converters, radiofrequency (RF) transceivers, operational amplifiers, and the like. In accordance with CMOS process technology, the IC dies 22 of wafer 24 use a combination of p-type and n-type metal-oxide-semiconductor field-effect-transistors (MOSFETs) to implement logic gates and other digital circuits.

For simplicity of illustration in the block diagram of FIG. 1, wafer 24 is represented by a rectangle and the multiple IC dies 22 are represented by a series of three rectangles that appear to be stacked one on top of the other. It should be readily apparent to those skilled in the art that IC dies 22 are not formed in a stacked relationship on a rectangular wafer 24. Rather the multiple IC dies 22 of wafer 24 are laterally spaced from one another relative to the plane of wafer 24.

System 20 generally includes a wafer test unit 26 having a probe card 28, and a plurality of subsystems 32 formed on wafer 24. Wafer test unit 26 may be a conventional tester, sometimes referred to as a wafer prober, used to test integrated circuits. Wafer test unit 26 can include one or more processors 34, a power source 36, and a memory element 38. In general, processor 34 may control the operation of probe card 28 and power source 36. Processor 34 may additionally, or alternatively, enable access to and from memory element 38. Those skilled in the art will recognize that wafer test unit 26 can include a variety of functional elements and mechanisms for loading and unloading wafers 24 onto a wafer chuck, pattern recognition optics for suitably aligning wafer 24 on the wafer chuck, and so forth. Details of these additional functional elements and mechanisms will not be explained in any greater extent than that considered necessary for the understanding and appreciation of the underlying concepts of the examples set forth herein and in order not to obscure or distract from the teachings herein.

Memory element 38 may have a digital test program 40 and a wafer die map 42, sometimes referred to as a wafermap, stored therein. As will be discussed in significantly greater detail below, digital test program 40 is used by system 20 to test IC dies 22 on wafer 24. Information regarding those IC dies 22 that are good, i.e., passing, may be stored in wafer die map 42 along with their locations on wafer 24. Wafer die map 42 may be used to categorize the passing and non-passing IC dies 22 by making use of bins. A bin can then be identified as containing good dies or as containing bad dies. Wafer die map 42 can then be sent to subsequent die handling equipment which only picks up the passing IC dies 22 by selecting the bin number of the good IC dies 22. In other systems, non-passing IC dies 22 may be marked with a small dot of ink in the middle of the dies in lieu of wafer die map 42. When ink dots are used, vision systems on subsequent die handling equipment can disqualify the IC dies 22 by recognizing the ink dot.

System 20 is particularly configured to enable non-contact communication of digital test program 40 from wafer test unit 26 to wafer 24. To that end, a magnetic field transmitter 44 is coupled to probe card 28. However, IC dies 22 must be energized prior to communication of digital test program 40 from wafer test unit 26 to wafer 24. Thus, at least one probe element 46 is additionally coupled to probe card 28. Probe element 46 is configured for touch down on at least one probe pad 48 on wafer 24. Probe pad 48, in turn, may be interconnected with one or more IC dies 22 via electrically conductive traces 52 to provide power to IC dies 22. As such, source power 54, labeled PWR, can be provided from power source 36 to each of IC dies 22 on wafer 24 via probe element 46, probe pad 48 and conductive traces 52 in order to energize the circuitry of IC dies 22.

After IC dies 22 are energized, subsystems 32 (one each of which is associated with one each of IC dies 22), can be programmed and IC dies 22 may be tested. In an embodiment, processor 34 accesses digital test program 40 from memory element 38 and converts digital test program 40 into a sequence of signals that are representative of digital test program 40. By way of example, digital test program 40 may be converted to its corresponding binary code, in the form of binary digits (e.g., 0's and 1's). This series of binary digits is referred to herein as binary code 56, and is labeled $P_B$ in FIG. 1.

Binary code 56 can be communicated from wafer test unit 36 to magnetic field transmitter 44. Magnetic field transmitter 44 does not physically contact IC dies 22 of wafer 24. Instead, magnetic field transmitter 44 can include one or more magnetic coil structures that generate and output a magnetic field, referred to herein as a magnetic signal 58, labeled $S_{MAG}$, corresponding to binary code 56. Magnetic signal 58 is emitted from magnetic field transmitter 44 over a relatively short distance as a change in the magnetic field around magnetic field transmitter 44. When magnetic field transmitter 44 includes more than one magnetic coil structure, magnetic signal 58 may be output from the multiple magnetic coil structures, in a serial or parallel manner, to collectively flood the entire wafer 24.

Accordingly, magnetic signal 58 is represented by a series of dashed lines to indicate its communication to wafer 24 via non-physical contact. Again by way of example, the output magnetic field (i.e., magnetic signal 58) may include two magnitudes, where one magnitude corresponds to a "0" in binary code 56 and another magnitude corresponds to a "1" in binary code 56. In an example embodiment, magnetic field transmitter 44 can modulate binary code 56 as a sequence of pulses of the magnetic field (e.g., ON and OFF pulses) or a sequence of magnetic field polarities (e.g., north (N) and south (S)) to generate magnetic signal 58. It should be understood however, that digital test program 40 may be converted into any suitable code that is thereafter output from magnetic field transmitter 44 as magnetic signal 58.

Each of subsystems 32 includes a digital magnetic sensor 60 formed with its associated IC die 22, a processor 62 in communication with digital magnetic sensor 60, and a memory element 64 in communication with processor 62. Digital magnetic sensor 60 is adapted to detect and receive magnetic signal 58. In operation, digital magnetic sensor 60 can sense, for example, the sequence of pulses of the magnetic field (e.g., ON and OFF pulses) or the sequence of magnetic field polarities (e.g., north (N) and south (S)) of magnetic signal 58. Digital magnetic sensor 60 may be, for example, a Hall effect sensor that varies its output voltage in response to a magnetic field, e.g., magnetic signal 58. As such, digital magnetic sensor 60 is referred to hereinafter as Hall effect sensor 60.

Hall effect sensor 60 can be a single crystal silicon-based sensor that does not include magnetic materials. As such, Hall effect sensor 60 can be readily fabricated in accordance with the process flow for constructing IC dies 22. Furthermore, magnetic signal 58 can readily penetrate inside wafer 24. Therefore, Hall effect sensor 60 need not be fabricated on the surface of wafer 24, but may instead be embedded within and under the surface of wafer 24.

Hall effect sensor 60 can decode the sensed magnetic signal 58 and communicate magnetic signal 58 as an output voltage 66, labeled $V_O$, to processor 62. In an embodiment, output voltage 66 corresponds with binary code 56. As such, processor 62 can convert or otherwise determine digital test program 40 from output voltage 66. Accordingly, processor 62, in cooperation with Hall effect sensor 60, is adapted to convert magnetic signal 58 to digital test program 40. Thereafter, processor 62 communicates digital test program 40 to memory element 64, where digital test program 40 is stored.

In accordance with a particular embodiment, magnetic field transmitter 44 is configured to flood an entire surface of wafer 24 with magnetic signal 58. Thus, each of subsystems 32 concurrently receives magnetic signal 58, converts magnetic signal 58 to digital test program 40, and stores digital test program 40 in memory element 64 of its corresponding IC die 22. Consequently, digital test program 40 can be loaded to all of IC dies 22 on wafer 24 in parallel via a remote magnetic field programming approach with Hall effect sensors 60 being the receiving elements without the need for physical communication from wafer test unit 26 on a die-by-die basis to each individual IC die 22.

Each of IC dies 22 includes functional circuitry 68. Additionally, each of IC dies 22 may include a built-in self-test (BIST) mechanism 70, or BIST processor. BIST mechanism 70 permits each of IC dies 22 to test itself in order to determine the functionality of its associated IC die. By way of example, BIST mechanism 70 functions to verify all or a portion of the internal functionality of its corresponding IC die 22 and produce a test result 72 of that functionality. Thus, BIST mechanism 70 can be implemented to perform faster, less-expensive integrated circuit testing.

In a wafer level testing scenario, processor 62 functions as a BIST controller and digital test program 40 includes a minimal set of instructions for initiating execution of BIST mechanism 70, receiving and storing test result 72 in memory element 64, and thereafter communicating test result 72 to wafer test unit 26. In an embodiment discussed below, processor 62 may modulate source power 54 in accordance with test result 72 to produce modulated source power 74, labeled PWR(MOD). Modulated source power 74 containing test result 72 can then be returned to wafer test unit 26 via probe element 46.

In one example, test result 72 may be a simple PASS or FAIL result. In an embodiment, modulated source power 74 may be produced by modulating the voltage of source power 54 provided to IC dies 22. For example, the voltage may be modulated to produce one voltage magnitude for a PASS result and a different voltage magnitude for a FAIL result. In another embodiment, processor 62 may modulate the current of source power 54 in accordance with test result 72 to produce a modulated source power 74. By way of example, the current may be modulated to produce higher current (e.g., higher power) for a PASS result and a lower current (e.g., lower power) for a FAIL result. Modulated source power 74 containing test result 72 can then be return to wafer test unit 26 via probe element 46.

Accordingly, execution of each digital test program 40, loaded to all of IC dies 22 on wafer 24 in parallel via a remote magnetic field programming approach, controls operation of BIST mechanism 70 on each IC die 22. Therefore, all IC dies 22 on wafer 24 can be tested and probed without the need for wafer test unit 26 to program each IC die 22 with digital test program 40 individually in series, without executing BIST mechanism 70 of each IC die 22 individually in series, and without requiring physical die-by-die indexing of probe element 46 to receive test result 72. Thus, each of IC dies 22 may be tested in parallel which can significantly reduce test time for an entire wafer 24 and therefore significantly reduce test costs.

Figure 2:
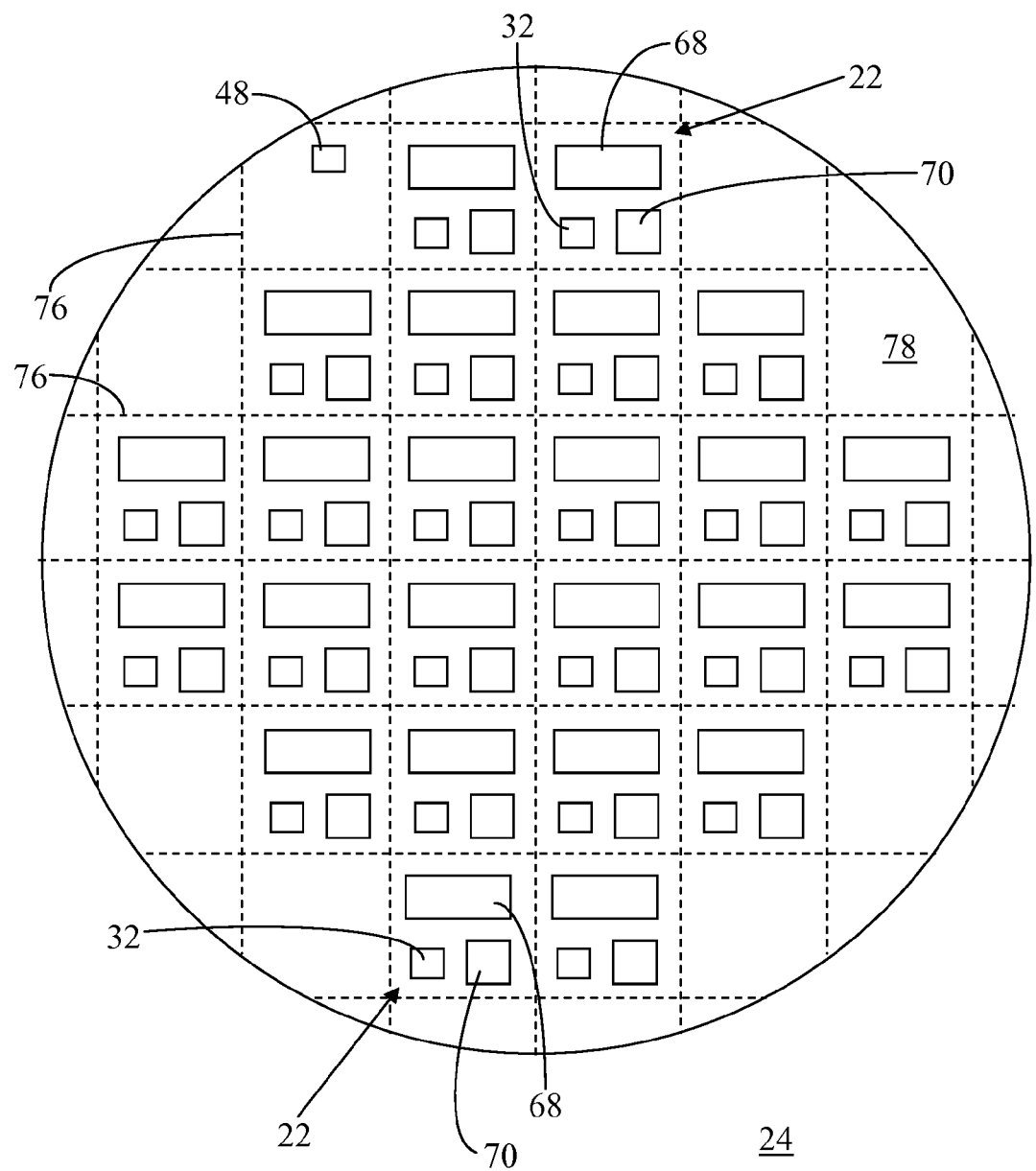
FIG. 2 shows a simplified top view of the wafer of FIG. 1.

FIG. 2 shows a simplified top view of wafer 24 of FIG. 1 on or in which IC dies 22 are formed. Each of IC dies 22 can include functional circuitry 68, BIST mechanism 70, and subsystem 32. Additionally, wafer 24 can include probe pad 48 located in an unused portion of wafer 24, such as at an outer periphery of wafer 24. Conductive traces 52, as well as other unspecified interconnections, are not shown for simplicity. Wafer 24 includes only a few IC dies 22 for simplicity of illustration. Those skilled in the art will recognize that a single wafer can include hundreds, thousands, or even tens of thousands of individual IC dies 22.

IC dies 22 are separated by scribe lines 76 formed in a surface 78 of wafer 24. A first set of scribe lines 76 may extend parallel to one another in one direction, i.e., horizontally across a surface 78 of wafer 24. Another set of scribe lines 76 may extend substantially parallel to one another across surface 78 of wafer 24 in a different direction or substantially orthogonal to the first set of scribe lines 76. Scribe lines 76 may form substantially square or rectangular areas, each of which define IC die 22 or semiconductor chip. Scribe lines 76 can be used to separate each of IC dies 22 after fabrication. In an example, each subsystem 32 is located within an area circumscribed by scribe lines 76. However, scribe lines 76 may have a predetermined width that permits subsystems 32 and/or conductive traces 52 (shown in FIG. 1) to be located within scribe lines 76. Thus, IC dies 22 may be tested at wafer level, i.e., prior to dicing, during the manufacturing process.

Each subsystem 32 is located within an area circumscribed by scribe lines 76 to emphasize that each IC die 22 may have a Hall effect sensor 60, processor 62, and memory element 64 (FIG. 1) associated with it. It should be understood that various alternative subsystem configurations may be envisioned. For example, one Hall effect sensor 60 may be associated with more than one IC die 22 but less than all of the IC dies 22 on wafer 24 and communicate its output via conductive lines (not shown) to a plurality subsystems associated with the subset of IC dies 22, where each of the subsystems includes one of processors 62 and memory elements 64. Furthermore, a single probe pad 48 is shown for simplicity of illustration. However, wafer 24 can include multiple probe pads 48, each of which can communicate source power 54 (FIG. 1) to a subset of IC dies 22.

Figure 3:
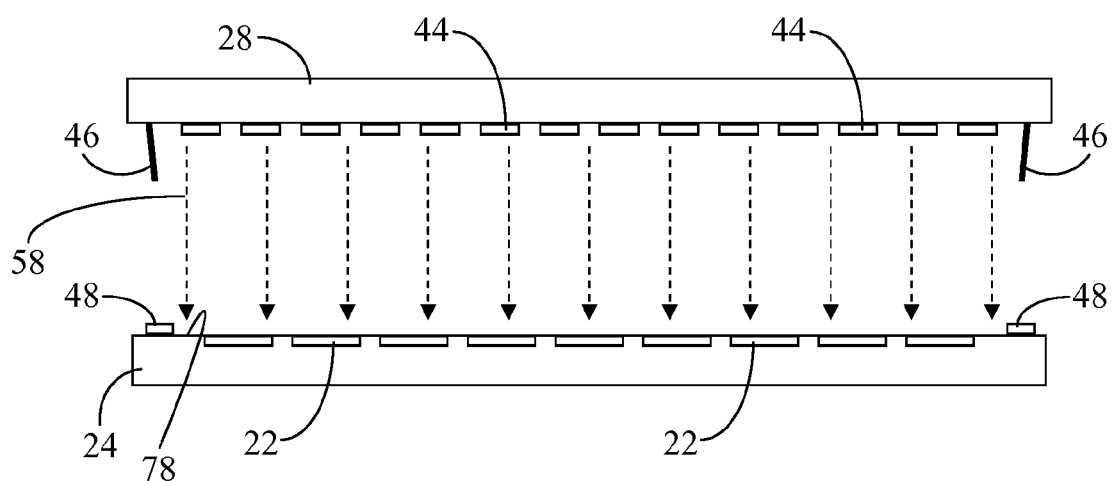
FIG. 3 shows a simplified side view of a probe card of the system and a wafer under test.

FIG. 3 shows a simplified side view of probe card 28 of system 20 (FIG. 1) and wafer 24 under test. More particularly, probe card 28 is shown with magnetic field transmitter 44, e.g., one or more coils, for outputting magnetic signal 58, and two probe elements 46. Wafer 24 is shown with a number of IC dies 22 formed therein, where each IC die 22 includes functional circuitry 68 (FIG. 1), BIST mechanism 70 (FIG. 1), and one of subsystems 32 (FIG. 1) that includes Hall effect sensor 60 (FIG. 1) for receiving magnetic signal 58.

Probe elements 46 may touch down onto probe pads 48 formed on wafer 24 to provide source power 54 (FIG. 1). However, magnetic field transmitter 44 does not physically contact IC dies 22 or wafer 24. Rather, magnetic field transmitter 44 floods the entire surface 78 of wafer 24 with magnetic signal 58 to enable parallel programming of all of IC dies 22 on wafer 24 via a remote magnetic field programming approach.

Figure 4:
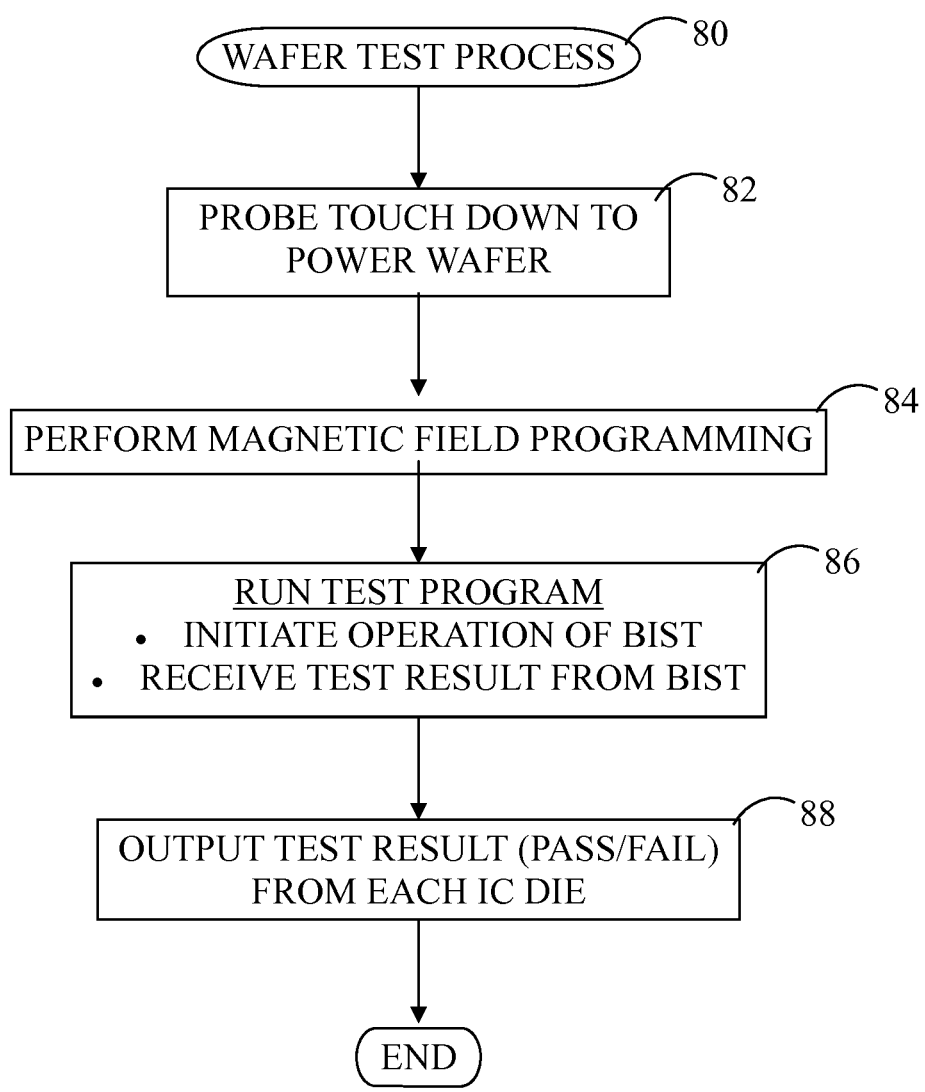
FIG. 4 shows a flowchart of a wafer test process.

Now referring to FIG. 4 in conjunction with FIG. 1, FIG. 4 shows a flowchart of a wafer test process 80 that may be performed utilizing system 20 during, for example, wafer manufacturing. Wafer test process 80 provides a generalized description of the operations for implementing a contactless magnetic field programming approach to concurrently program all of IC dies 22 on wafer 24. Furthermore, wafer test process 80 combines the magnetic field programming approach for download of a test program with built-in self-test (BIST) mechanism 70 within each of IC dies 22 in order to perform wafer level testing/probing of IC dies 22 without indexing or stepping wafer test unit 26 between each of IC dies 22 on wafer 24.

At a block 82 of wafer test process 80, touchdown of probe element(s) 46 to probe pad(s) 48 of wafer 24 is performed in order to supply source power 54 to wafer 24. Wafer test process 80 continues at a block 84. At block 84, remote magnetic field programming is performed to concurrently program all of IC dies 22 on wafer 24. Magnetic field programming is discussed hereinafter in connection with FIG. 5. At a block 86, the test program, i.e., digital test program 40, is run at each of IC dies 22. Execution of digital test program 40 initiates execution of BIST mechanism 70 and enables receipt at processor 62 of test result 72.

At a block 88, test result 72, e.g., PASS or FAIL, for each IC die 22 is output from its associated subsystem 32. In one example, each of IC dies 22 may be successively enabled to modulate source power 54 to produce modulated source power 74, where the specific modulation pattern indicates PASS or FAIL. Modulated source power 74 can be communicated from wafer 24 to wafer test unit 26. The PASS/FAIL state of each IC die 22 may subsequently be recorded in wafer die map 42. Following block 88, wafer level testing is complete and wafer test process 80 ends.

Referring now to FIGS. 1 and 5, FIG. 5 shows a flowchart of a magnetic programming process 90 executed in connection with wafer test process 80 (FIG. 4). More particularly, magnetic programming process 90 is performed to concurrently program all IC dies 22 on wafer 24 at block 84 of process 80 in accordance with a particular embodiment of the invention.

At a block 92 of magnetic programming process 90, processor 34 and magnetic field transmitter 44 suitably convert digital test program 40 to magnetic signal 58, as discussed above. At a block 94, magnetic field transmitter 44 outputs magnetic signal 58. Again, magnetic signal 58 may be sequence of pulses of the magnetic field (e.g., ON and OFF pulses), a sequence of magnetic field polarities (e.g., north (N) and south (S)), or any other variable magnetic field corresponding to digital test program 40.

In response to the transmission of magnetic signal 58 at block 94, magnetic signal 58 is detected by (i.e., received at) each of Hall effect sensors 60 embedded in wafer 24 at a block 96. At a block 98, processors 62 in wafer 24 convert the received magnetic signal 58 to digital test program 40. Thereafter, digital test program 40 is stored in memory element 64 of each subsystem 32 on wafer 24 at a block 100 and magnetic programming process 90 ends. Thus, the outcome of magnetic programming process 90 is to concurrently download digital test program 40 to all IC dies 22 on wafer 24 that were identified as being "good" (i.e., not having a short circuit). This downloaded and stored digital test program 40 is stored for later execution in accordance with wafer test process 80 (FIG. 4).

It is to be understood that certain ones of the process blocks depicted in FIGS. 4 and 5 may be performed in parallel with each other or with performing other processes. In addition, it is to be understood that the particular ordering of the process blocks depicted in FIGS. 4 and 5 may be modified, while achieving substantially the same result. Accordingly, such modifications are intended to be included within the scope of the inventive subject matter.

Thus, a system and a method for programming IC dies formed on a wafer have been described. An embodiment of a system for programming IC dies formed on a wafer comprises a magnetic field transmitter configured to output a digital program as a magnetic signal and a digital magnetic sensor formed with the IC dies of the wafer, the digital magnetic sensor being configured to receive the magnetic signal from the magnetic field transmitter. The system further comprises a processor formed on the wafer and in communication with digital magnetic sensor, the processor being adapted to convert the magnetic signal to the digital program, and a memory element associated with one of the IC dies on the wafer, the memory element being adapted to store the digital program.

An embodiment of a method of programming IC dies formed on a wafer comprises transmitting a digital program as a magnetic signal from a magnetic field transmitter and receiving the magnetic signal from the magnetic field transmitter at a digital magnetic sensor formed with the IC dies of the wafer. The method further comprises converting the magnetic signal to the digital program at a processor formed on the wafer and in communication with the digital magnetic sensor, and storing the digital program in a memory element associated with one of the IC dies on the wafer.

The systems and processes, discussed above, and the inventive principles thereof provide a remote magnetic field programming approach to concurrently program all of the IC dies on the a wafer without the need for separate communication between the test unit and each individual IC die. Accordingly, test time and cost can be dramatically reduced. Furthermore, by combining the magnetic programming approach for download of a test program with built-in self-test (BIST) functionality, wafer level testing/probing of the IC dies can be carried out without indexing or stepping the tester between each of the IC dies on the wafer in order to further reduce test time and test cost.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system for programming integrated circuit (IC) dies formed on a wafer comprising:
   a magnetic field transmitter configured to output a digital program as a magnetic signal;
   a digital magnetic sensor formed with said IC dies of said wafer, said digital magnetic sensor being configured to receive said magnetic signal from said magnetic field transmitter;
   a processor formed on said wafer and in communication with said digital magnetic sensor, said processor being adapted to convert said magnetic signal to said digital program; and
   a memory element associated with one of said IC dies on said wafer, said memory element being adapted to store said digital program, wherein said one of said IC dies includes a built-in self-test (BIST) mechanism configured to determine a functionality of said one of said IC dies and produce a test result indicative of said functionality of said one of said IC dies, and said processor is configured to communicate with said BIST mechanism and execute said digital program, wherein execution of said digital program initiates operation of said BIST mechanism and receipt of said test result at said processor from said BIST mechanism.

2. The system of claim 1 wherein said magnetic field transmitter does not physically contact said IC dies.

3. The system of claim 1 wherein said magnetic field transmitter is adapted to modulate said digital program as a sequence of pulses of a magnetic field, said sequence of pulses forming said magnetic signal.

4. The system of claim 1 wherein said magnetic field transmitter includes at least one magnetic coil configured to output said magnetic signal.

5. The system of claim 1 wherein said digital magnetic sensor comprises a Hall effect sensor.

6. The system of claim 1 wherein said digital magnetic sensor is embedded within said wafer.

7. The system of claim 1 wherein said digital magnetic sensor is one of a plurality of digital magnetic sensors, one each of said digital magnetic sensors being formed with one each of said IC dies of said wafer.

8. The system of claim 1 wherein said processor is one of a plurality of processors, one each of said processors being formed with one each of said IC dies of said wafer, and said each of said processors is adapted to receive and convert said magnetic signal to said digital program.

9. The system of claim 1 wherein said memory element is one of a plurality of memory elements, one each of said memory elements being formed with one each of said IC dies of said wafer, and said each of said memory elements is adapted to store said digital program.

10. The system of claim 1 further comprising:
a wafer test unit having a probe card, said magnetic field transmitter and a probe element being coupled to said probe card, wherein said probe element provides source power; and
a probe pad on said wafer and electrically coupled with said IC dies, said probe element being configured to touch said probe pad to selectively provide said source power to each of said IC dies.

11. The system of claim 10 wherein said processor is further configured to modulate said source power in accordance with said test result to return said test result to said wafer test unit.

12. A system for programming integrated circuit (IC) dies formed on a wafer comprising:
a wafer test unit having a probe card;
a magnetic field transmitter coupled to said probe card and configured to output a digital program as a magnetic signal;
a probe element coupled to said probe card, said probe element providing source power;
a probe pad on said wafer and electrically coupled with said IC dies, said probe element being configured to touch said probe pad to selectively provide said source power to each of said IC dies;
a plurality of subsystems, one each of said subsystems being formed with one each of said IC dies of said wafer, each of said subsystems comprising:
a digital magnetic sensor for receiving said magnetic signal from said magnetic field transmitter;
a processor in communication with said digital magnetic sensor for converting said magnetic signal to said digital program; and
a memory element in communication with said processor for storing said digital program, wherein said magnetic field transmitter is configured to output said magnetic signal such that each of said subsystems concurrently receives said magnetic signal, and said processor of said each of said subsystems converts said magnetic signal to said digital program and stores said digital program in said memory element of said each of said subsystems.

13. The system of claim 12 wherein said magnetic field transmitter does not physically contact said IC dies.

14. The system of claim 12 wherein each of said IC dies includes a built-in self-test (BIST) mechanism to determine a functionality of said each of said IC dies, said processor is configured to communicate with said BIST mechanism and execute said digital program, wherein execution of said digital program initiates operation of said BIST mechanism and receipt of a test result from said BIST mechanism, said test result being indicative of said functionality of said one of said IC dies, and said processor is further configured to modulate said source power in accordance with said test result to return said test result to said wafer test unit.

15. A method of programming integrated circuit (IC) dies formed on a wafer, wherein a wafer test unit includes a probe card having a magnetic field transmitter and a probe element coupled to said probe card;
fabricating a probe pad on said wafer that is electrically coupled with said IC dies;
touching said probe element on said probe pad to selectively provide source power to each of said IC dies;
following provision of said source power, transmitting a digital program as a magnetic signal from a magnetic field transmitter without said magnetic field transmitter element contacting said IC dies;
receiving said magnetic signal from said magnetic field transmitter at a digital magnetic sensor formed with said IC dies of said wafer;
converting said magnetic signal to said digital program at a processor formed on said wafer and in communication with said magnetic field transmitter; and
storing said digital program in a memory element associated with one of said IC dies on said wafer.

16. The method of claim 15 further comprising:
fabricating said wafer to include a plurality of subsystems, one each of said subsystems being formed with one each of said IC dies of said wafer, each of said subsystems comprising said digital magnetic sensor, said processor in communication with said digital magnetic sensor, and said memory element in communication with said processor; and
outputting said magnetic signal from said magnetic field sensor such that each of said subsystems concurrently receives said magnetic signal, and each said processor converts said magnetic signal to said digital program and stores said digital program in said memory element of said each of said subsystems in association with said one each of said IC dies.

* * * * *